United States Patent [19]

Hara

[11] Patent Number: 5,425,982

[45] Date of Patent: Jun. 20, 1995

[54] MULTI-LAYER WIRING STRUCTURE FOR SEMICONDUCTOR DEVICE AND METHOD OF MAKING THE SAME

[75] Inventor: Tatsuya Hara, Tokyo, Japan

[73] Assignee: Nippon Steel Corporation, Tokyo, Japan

[21] Appl. No.: 119,859

[22] Filed: Sep. 13, 1993

[30] Foreign Application Priority Data

Sep. 14, 1992 [JP] Japan .................................. 4-271035

[51] Int. Cl.[6] .............................................. B32B 9/00
[52] U.S. Cl. ................................... 428/210; 428/615; 428/620
[58] Field of Search .................... 428/210, 615, 620

[56] References Cited

U.S. PATENT DOCUMENTS

| | | | |
|---|---|---|---|
| 4,020,221 | 4/1977 | Kusakawa et al. | 428/210 |
| 4,490,429 | 12/1984 | Tosaki et al. | 428/195 |
| 4,732,801 | 3/1988 | Joshi | 428/210 |

OTHER PUBLICATIONS

"Next Generation Ultra LSI Process Technique", Realize Inc., Apr. 30, 1988, pp. 238–241.

*Primary Examiner*—Patrick J. Ryan
*Assistant Examiner*—Kam F. Lee
*Attorney, Agent, or Firm*—Pollock, Vande Sande & Priddy

[57] ABSTRACT

A multi-layer wiring structure for a semiconductor device comprises: a first insulating interlayer formed on a semiconductor substrate on which a semiconductor element is formed; an elongated lower wiring layer extending on the first insulating interlayer and connected to the semiconductor element; a second insulating interlayer formed to cover the first insulating interlayer and the lower wiring layer; a first via hole formed through the second insulating interlayer to reach the lower wiring layer; a blocking conductive layer formed to fill the first via hole; connecting to the lower wiring layer and extending over a first area on the second insulating interlayer; a third insulating interlayer formed to cover the second insulating interlayer and the blocking conductive layer; a second via hole formed through the third insulating interlayer to reach the blocking conductive layer; and an elongated upper wiring layer filling the second via hole to connect the upper wiring layer to the blocking conductive layer with a pattern extending on the third insulating interlayer; wherein the upper wiring layer overlaps the lower wiring layer at a second area as viewed in a direction perpendicular to the substrate, with the second via hole having a cross-section larger than the second area and smaller than the first area and the blocking conductive layer being made of a material different from the material of the upper wiring layer so that the blocking conductive layer functions as an etching stopper while etching patterning of the upper wiring layer.

5 Claims, 4 Drawing Sheets he present invention relates to a multi-layer wiring structure for semiconductor device and a method of making the same.

MULTI-LAYER WIRING STRUCTURE FOR SEMICONDUCTOR DEVICE AND METHOD OF MAKING THE SAME

FIELD OF THE INVENTION

The present invention relates to a multi-layer wiring structure for semiconductor device and a method of making the same.

BACKGROUND OF THE INVENTION

In order to make semiconductor devices finer and the operating speed thereof higher, it is proposed to use a multi-layer wiring structure such that multiple layers of wiring, especially metal wiring are stacked and wiring of an upper layer and wiring of a lower layer are electrically interconnected through a via hole formed in an insulating interlayer layer. Typically in such a multi-layer wiring, via holes are tapered and side walls of the via holes are sloped as disclosed, for example, in "Next Generation Ultra LSI Process Technique", published by Realize Inc. on Apr. 30, 1988, pp 238–241, in order to assure continuity of wiring at steps of via holes, i.e., step coverage and avoid breakage of wiring.

If wiring of an upper layer and wiring of a lower layer are made of the same material, such as Al, and a via hole has a diameter larger than the width of the wiring of the upper layer, then wiring of the lower layer would be simultaneously etched at the time of etching the wiring of the upper layer for patterning. Conventionally, therefore, it is necessary to make the size of each via hole smaller than the width of wiring of the upper layer. As semiconductor devices become finer and the width of wiring becomes narrower, therefore, the size of via hole has become smaller.

On the other hand, the thickness of insulating interlayer is required to be at least 0.6 $\mu$m in order to assure interlayer insulation and suppress increase of the capacitance between upper and lower wiring. Therefore, the aspect ratio of the via hole becomes large. As a result, it becomes difficult to form the via hole with a taper. Even if the via hole is formed with a taper, the step coverage of wiring of the upper layer in the via hole is reduced. The conventional multi-layer wiring structure, therefore, does not have high reliability.

SUMMARY OF THE INVENTION

An object of the present invention is to provide a reliable multi-layer wiring structure for semiconductor device with higher step coverage of wiring of the upper layer at the via hole while preventing the lower layer wiring from simultaneous etching at the time of etching the wiring of the upper layer for patterning. The object of the present invention is also to provide a method of making the multi-layer wiring structure as above-mentioned.

A multi-layer wiring structure for semiconductor device according to the present invention includes a first insulating interlayer formed on a surface of a semiconductor substrate formed with a semiconductor element; elongated lower wiring extending on the first insulating interlayer and connected to the semiconductor element; a second insulating interlayer formed so as to cover the first insulating interlayer and the lower wiring; a conductive layer formed at a first selected area on the second insulating interlayer and connected to the lower wiring through a first via hole formed in the second insulating interlayer; a third insulating interlayer formed so as to cover the second insulating interlayer and the conductive layer; and elongated upper wiring made of a conductive material having an etching characteristic different from that of the conductive layer, the upper wiring extending on the third insulating interlayer and connected to the conductive layer through a second via hole formed in the third insulating interlayer, wherein the upper wiring and the lower wiring overlap with each other at a second selected area as viewed in a direction perpendicular to the substrate, the first selected area is larger than the second selected area and the second via hole has a cross-section larger than that of the second selected area.

A method of making a multi-layer wiring structure for semiconductor device according to the present invention includes the steps of: forming a first insulating interlayer on a surface of a substrate formed with a semiconductor element; forming elongated lower wiring extending on the first insulating interlayer and connected to the semiconductor element; forming a second insulating interlayer so as to cover the first insulating interlayer and the lower wiring; forming a first via hole in the second insulating interlayer so as to expose the lower wiring; forming a conductive layer at a first selected area on the second insulating interlayer, the conductive layer being connected to the lower wiring through the first via hole; forming a third insulating interlayer so as to cover the second insulating interlayer and the conductive layer; forming a second via hole in the third insulating interlayer so as to expose the conductive layer; forming elongated upper wiring of a conductive material having an etching characteristic different from that of the conductive layer so as to extend on the third insulating interlayer and connected to the conductive layer through the second via hole, wherein the upper wiring and the lower wiring overlap with each other at a second selected area as viewed in a direction perpendicular to the substrate, the first selected area is larger than the second selected area and the second via hole has a cross-section larger than that of the second selected area.

In the present invention, the upper wiring and the lower wiring overlap with each other at the second selected area, and the cross-section of the second via hole is larger than that of the second selected area. Therefore, even if the thickness of the third insulating interlayer in which the second via hole is formed is made large, the aspect ratio of the second via hole becomes small and the step coverage of the upper wiring in the second via hole can be improved. On the other hand, the conductive layer is provided between the upper wiring and the lower wiring to extend on the first selected area larger than the second selected area, and the upper wiring is made of a material having an etching characteristic different from that of the conductive layer, so that the etching for patterning of the upper wiring is blocked by the conductive layer from reaching the lower wiring.

DESCRIPTION OF THE PREFERRED EMBODIMENTS

A first embodiment of the present invention will now be described by referring to FIGS. 1 to 6.

Figure 4:
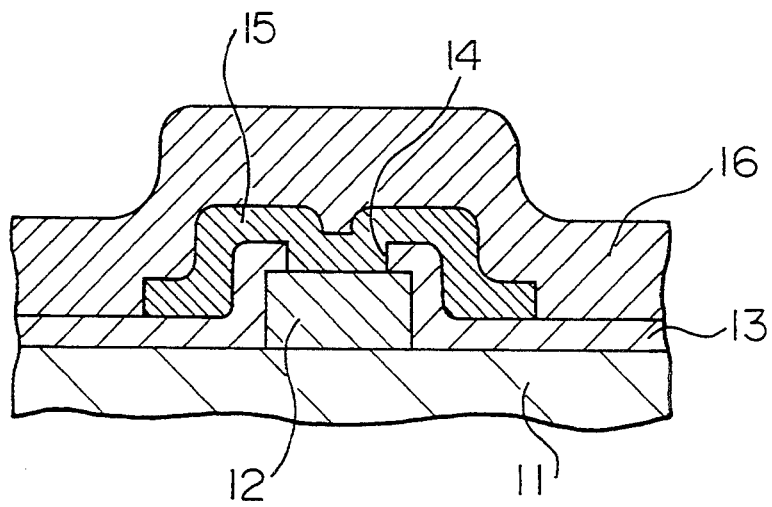
Figure 5:
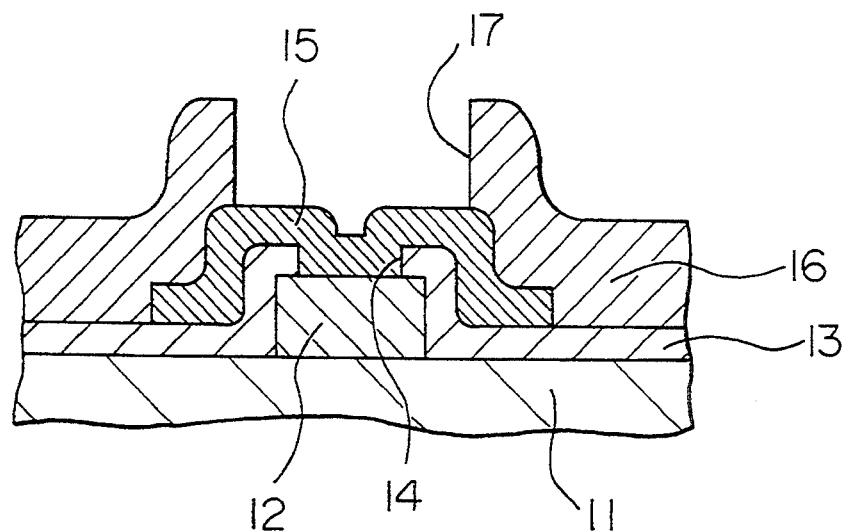
Figure 6:
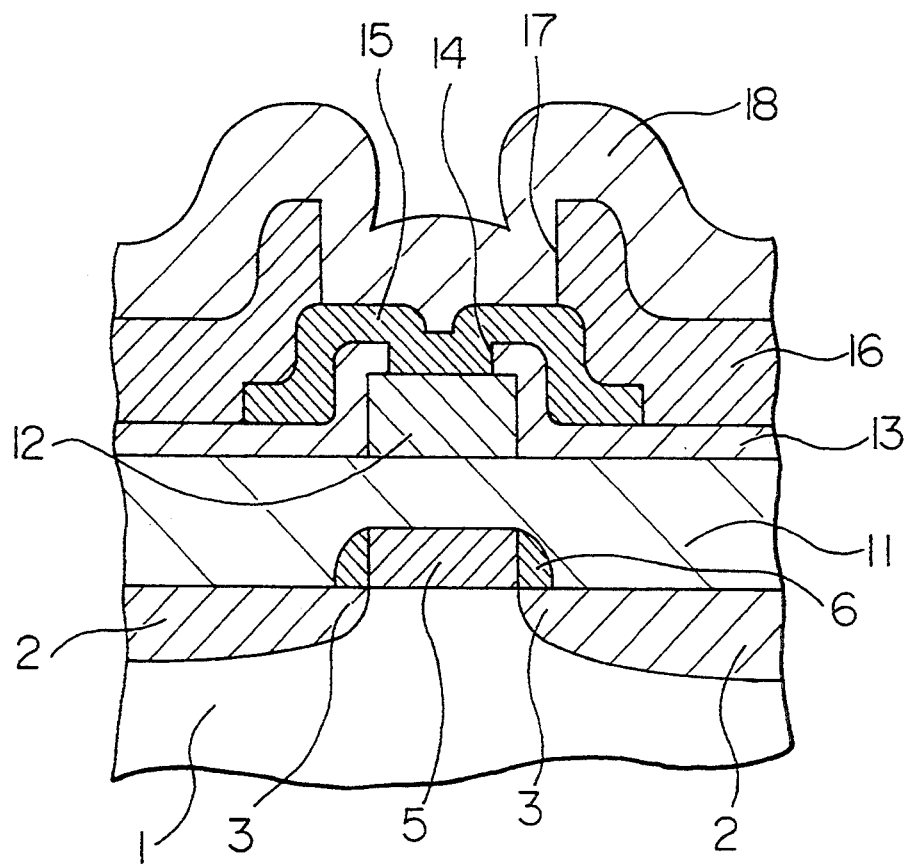

A multi-layer wiring structure of the present invention is used to interconnect semiconductor elements or connect them to associated external terminals. FIG. 6 shows a relation between one of semiconductor elements typically formed on the surface of a semiconductor substrate 1, such as a MOS transistor having drain or source regions of LDD structure and a gate 5 provided with side wall spacers 6, and a multi-layer wiring structure. However, semiconductor element to which the multi-layer wiring structure of the present invention is applied are not limited to a specific structure and a specific form as illustrated. Furthermore, the structure and form of semiconductor elements to which the present invention is applied are irrelevant to the present invention. In FIGS. 1 to 5, therefore, the portion of the semiconductor element is omitted.

Figure 2:
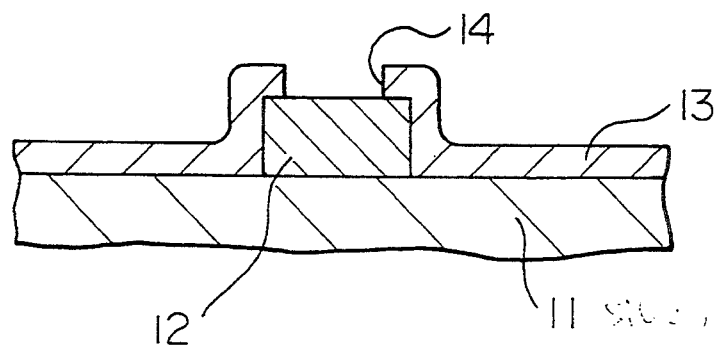
FIGS. 2 to 6 are diagrams taken along the line II—II of FIG. 1 showing respective processes for producing the multi-layer wiring structure of FIG. 1.

As shown in FIG. 2, an insulating interlayer 11 of $SiO_2$, SiN or BPSG is formed on the surface of a semiconductor substrate on which a semiconductor element such as a transistor is formed. Over that, a layer made of a metal material such as Al having low resistance, is formed. Thereafter, elongated metal wiring 12 extending at a right angle with respect to the sheet of FIG. 2 is patterned by etching. The metal wiring 12 provides lower wiring of the semiconductor element. The metal wiring 12 is electrically connected to a predetermined portion, such as the gate, of the semiconductor element via a contact hole (not shown).

Thereafter, an insulating interlayer 13 of $SiO_2$ or SiN is formed with a layer thickness of 200 to 500 nm so as to cover the metal wiring 12 and the insulating interlayer 11. Then, a via hole 14 reaching the metal wiring 12 is formed in the insulating interlayer 13.

Figure 1:
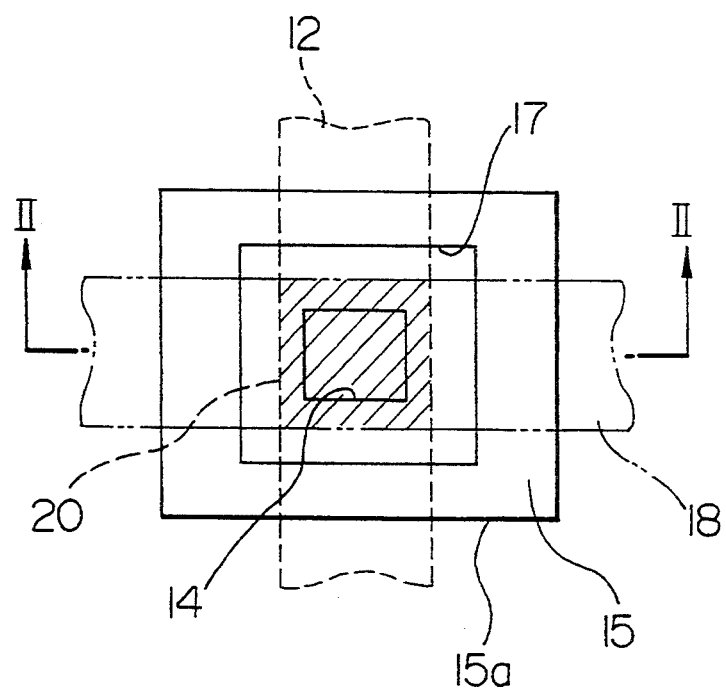
FIG. 1 is a top view of a multi-layer wiring structure for semiconductor device according to a first embodiment of the present invention.
Figure 3:
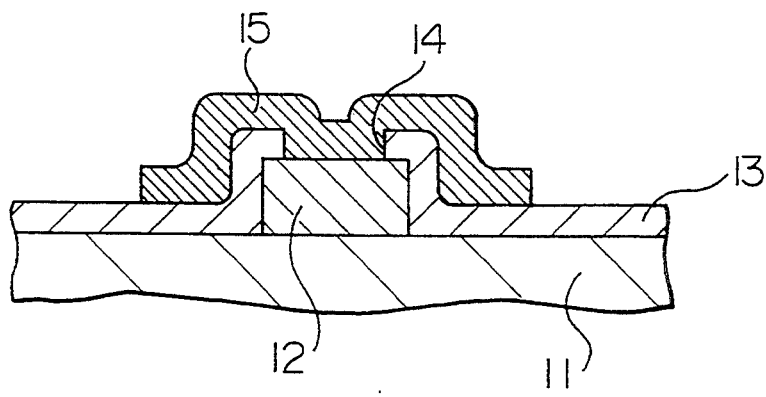

As shown in FIG. 3, the insulating interlayer 13 is then covered by a layer made of a conductive material including a high melting point metal such as tungsten, a silicide thereof, or a nitride thereof, or an alloy of tungsten and titanium. This layer of the conductive material is formed so as to be electrically connected to the metal wiring 12 through the via hole 14. Thereafter, this layer of the conductive material is patterned to form a conductive layer 15 extending over a predetermined area 15a including the via hole 14 as shown in FIG. 1. As shown in FIG. 4, an insulating interlayer 16 of $SiO_2$ or SiN is then formed on the conductive layer 15 with a layer thickness of 400 to 800 nm. Thereafter, a via hole 17 reaching the conductive layer 15 is formed in the insulating interlayer 16 as shown in FIG. 5.

Then the insulating interlayer 16 is covered by a layer of a metal material having low resistance such as Al. Thereafter, the layer is patterned by etching to form elongated upper metal wiring 18 extending at a right angle with respect to the lower metal wiring 12 as shown in FIG. 6. The metal wiring 18 is electrically connected to the conductive layer 15 through the via hole 17. As shown in FIG. 1, the lower metal wiring 12 and the upper metal wiring 18 overlap with each other at an area 20, shown by hatching in FIG. 1, as viewed in a direction perpendicular to the substrate. The cross-section of the via hole is larger than the above described area 20, and the area 20 is completely enclosed within the lower opening end of the via hole 17. On the other hand, the conductive layer 15 extends over an area 15a larger than the area 20, and the lower opening end of the via hole 17 is completely closed by the conductive layer 15.

In the first embodiment, the cross-section size of the via hole 17 is made larger than the area 20 where the upper wiring 18 and the lower wiring 12 overlap with each other. Even if the thickness of the insulating interlayer 16 is made large, the aspect ratio of the via hole 17 becomes small and excellent step coverage of the upper metal wiring 18 in the via hole 17 can be obtained.

On the other hand, the conductive layer 15 is made of a conductive material having an etching characteristic different from that of the metal wiring 18. In addition, the conductive layer extends over the area larger than the cross-section size of the via hole 17 so as to close completely the lower opening end of the via hole 17. When the metal wiring 18 is patterned by etching using gas containing chlorine as a main component, etching is blocked by the conductive layer 15 and does not reach the lower metal wiring 12. Even if the lower metal wiring 12 is made of Al, i.e. the same material as the metal wiring 18, the lower wiring is prevented from being simultaneously etched when the upper wiring 18 is etched.

Figure 7:
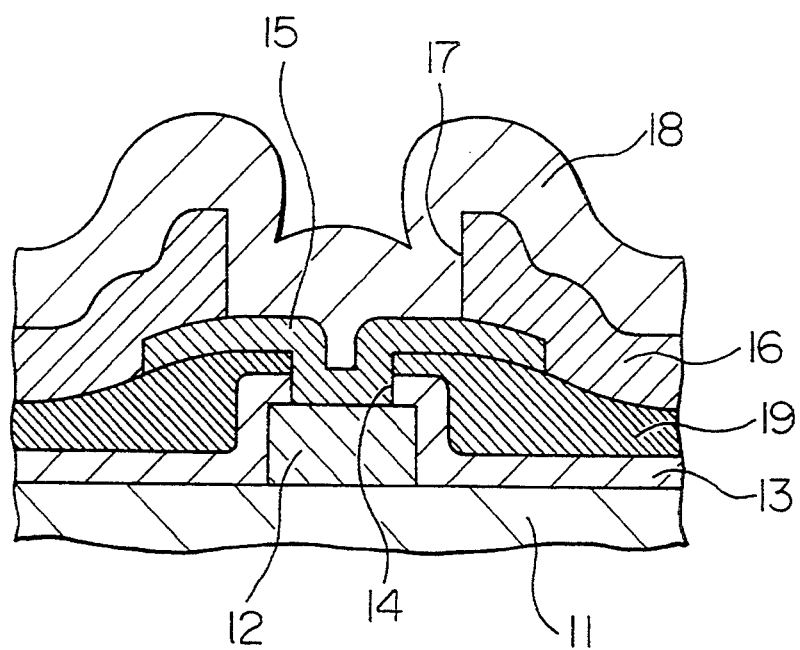
FIG. 7 is a top view of a multi-layer wiring structure for semiconductor device according to a second embodiment of the present invention.

A second embodiment will now be described by referring to FIG. 7. In FIG. 7 as well, the portion of the semiconductor element is omitted. The second embodiment is substantially identical to the first embodiment except that a layer 19 of silanol, polyimide or SOG is applied to the insulating interlayer 13 before the via hole is formed in order to flatten the surface of the insulating interlayer 13.

The conductive layer 15 made of tungsten is not adversely affected by moisture or organic material contained in the layer 19 unlike the layer of Al. Therefore, in the second embodiment, the upper wiring layer of Al is protected by the conductive layer 15 made of tungsten from damage, which would be otherwise derived by the moisture or organic material contained in the layer 19.

According to the present invention, the step coverage of the upper wiring in the via hole is excellent, and in addition the lower wiring is prevented from being simultaneously etched at the time of etching the upper wiring for patterning. Therefore, it is possible to provide a highly reliable multi-layer wiring structure for semiconductor device.

I claim:

1. A multi-layer wiring structure for a semiconductor device comprising:
    a first insulating interlayer formed on a semiconductor substrate on which a semiconductor element is formed;
    an elongated lower wiring layer extending on said first insulating interlayer and connected to said semiconductor element;
    a second insulating interlayer formed to cover said first insulating interlayer and said lower wiring layer;
    a first via hole formed through said second insulating interlayer to reach said lower wiring layer;
    a blocking conductive layer formed to fill said first via hole connecting said blocking conductive layer to said lower wiring layer and extending over a first area on said second insulating interlayer;

a third insulating interlayer formed to cover said second insulating interlayer and said blocking conductive layer;

a second via hole formed through said third insulating interlayer to reach said blocking conductive layer; and an elongated upper wiring layer formed to fill said second via hole connecting said upper wiring layer to said blocking conductive layer and having a pattern extending on said third insulating interlayer;

wherein said upper wiring layer overlaps said lower wiring layer at a second area as viewed in a direction perpendicular to said substrate, said second via hole has a cross-section larger than said second area and smaller than said first area and said blocking conductive layer is made of a material different from a material of said upper wiring layer whereby said blocking conductive layer is an etching stopper for etching in patterning of said upper wiring layer.

2. A multi-layer wiring structure according to claim 1, wherein said upper wiring layer and said lower wiring layer are made of the same material.

3. A multi-layer wiring structure according to claim 2, wherein said upper wiring layer and said lower wiring layer are made of aluminum, and said conductive layer is made of one of a high melting point metal, a silicide thereof, and a nitride thereof.

4. A multi-layer wiring structure according to claim 2, wherein said upper wiring layer and said lower wiring layer are made of aluminum, and said conductive layer is made of an alloy of tungsten and titanium.

5. A multi-layer wiring structure according to claim 1, further comprising a fourth insulating interlayer applied to said second insulating interlayer, said first via hole being formed through said second insulating interlayer and said fourth insulating interlayer.

* * * * *